US011258521B2

United States Patent
Asami et al.

(10) Patent No.: US 11,258,521 B2
(45) Date of Patent: Feb. 22, 2022

(54) FRONT-END CIRCUIT

(71) Applicant: Advantest Corporation, Tokyo (JP)

(72) Inventors: Koji Asami, Tokyo (JP); Takahiro Kudo, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 17/021,496

(22) Filed: Sep. 15, 2020

(65) Prior Publication Data

US 2020/0412458 A1 Dec. 31, 2020

Related U.S. Application Data

(63) Continuation of application No. PCT/JP2019/019190, filed on May 14, 2019.

(30) Foreign Application Priority Data

May 28, 2018 (JP) .............................. JP2018-101241

(51) Int. Cl.
*H04B 3/46* (2015.01)
*H04B 17/00* (2015.01)
(Continued)

(52) U.S. Cl.
CPC ........... *H04B 17/0085* (2013.01); *H04B 1/04* (2013.01); *H04B 1/16* (2013.01); *H04B 17/10* (2015.01);
(Continued)

(58) Field of Classification Search
CPC ......... H04L 1/20; H04L 1/24; H04L 27/2636; H04L 27/368; H04L 5/0007; H04B 1/075; H04B 17/0085
(Continued)

(56) References Cited

U.S. PATENT DOCUMENTS

| 4,896,102 A | 1/1990 | DuBois |
| 2001/0028687 A1* | 10/2001 | Kaneko ............... H04L 27/2627 375/296 |

(Continued)

FOREIGN PATENT DOCUMENTS

| CN | 101558318 A | 10/2009 |
| JP | 2004032446 A | 1/2004 |

(Continued)

OTHER PUBLICATIONS

International Search Report for International Application No. PCT/JP2019/019190, dated Jul. 23, 2019.
International Preliminary Report on Patentability with Written Opinion of the International Searching Authority; International Application No. PCT/JP2019/019190; dated Dec. 1, 2020.
(Continued)

*Primary Examiner* — Khai Tran
(74) *Attorney, Agent, or Firm* — Cantor Colburn LLP

(57) ABSTRACT

A front-end circuit is used to test an RF signal from an RF device. The RF signal is generated by modulating a carrier signal having a carrier frequency with a wideband baseband signal. A variable frequency oscillator generates a local signal having a variable local frequency. The first frequency mixer frequency mixes a local signal and an RF signal to generate an IF signal having a frequency. A band-pass type first filter filters the IF signal. The local frequency can be selected from a plurality of frequencies having a frequency interval equal to or narrower than a bandwidth of the first filter.

11 Claims, 12 Drawing Sheets

(51) Int. Cl.
*H04B 17/10* (2015.01)
*H04B 17/20* (2015.01)
*H04B 1/04* (2006.01)
*H04B 1/16* (2006.01)
*H04L 5/00* (2006.01)
*H04L 25/03* (2006.01)
*H04L 27/26* (2006.01)

(52) U.S. Cl.
CPC ............. *H04B 17/20* (2015.01); *H04L 5/001* (2013.01); *H04L 25/03* (2013.01); *H04L 27/2627* (2013.01)

(58) Field of Classification Search
USPC ........................................................ 375/224
See application file for complete search history.

(56) References Cited

U.S. PATENT DOCUMENTS

2013/0107924 A1* 5/2013 Mattsson ............ H04L 27/2626
375/224
2014/0139287 A1* 5/2014 Oishi .................... H04L 27/368
330/149

FOREIGN PATENT DOCUMENTS

| JP | 2008076112 A | 4/2008 |
| JP | 2012175172 A | 9/2012 |
| TW | I439071 B | 5/2014 |

OTHER PUBLICATIONS

TIPO Notice of Rejection for corresponding TW Patent Application No. 108116702; dated Dec. 30, 2021.

* cited by examiner

FRONT-END CIRCUIT

CROSS REFERENCE TO RELATED APPLICATIONS

This application is a continuation under 35 U.S.C. § 120 of PCT/JP2019/019190, filed May 14, 2019, which is incorporated herein reference and which claimed priority to Japanese Application No. 2018-101241, filed May 28, 2018. The present application likewise claims priority under 35 U.S.C. § 119 to Japanese Application No. 2018-101241, filed May 28, 2018, the entire content of which is also incorporated herein by reference.

BACKGROUND

1. Technical Field

The present disclosure relates to analysis and evaluation of a radio frequency (RF) device.

2. Description of the Related Art

Along with the increase in the capacity of wireless communication, the bandwidth of baseband signals and RF signals has been increasing. In 5th generation mobile communication systems and next-generation wireless LANs, carrier signals in the millimeter wave band are used to carry wideband baseband signals ranging from several hundred MHz to several GHz.

Orthogonal frequency division multiplexing (OFDM) is often used for such high-speed communication. The OFDM is a type of multi-carrier modulation method in which data is divided into a plurality of carriers called subcarriers and transmitted in parallel in the frequency direction.

In the OFDM, the frequencies of subcarriers are selected so as to satisfy orthogonality (that is, the inner product is zero). As a result, even if adjacent subcarriers overlap each other in the frequency domain, it is possible to separate the adjacent subcarriers, so that there is an advantage that a guard band is unnecessary and frequency utilization efficiency is high.

FIGS. 1A and 1B are block diagrams of an OFDM modulator (transmitter) and demodulator (receiver). A modulator 10 will be described with reference to FIG. 1A. Here, it is assumed that N subcarriers $f_0$ to $f_{N-1}$ are used.

Serial data s[0] to be transmitted is converted into parallel data by an S/P converter 12 and divided into symbol data $sym_0$ to $sym_{N-1}$ for each subcarrier. Each of a plurality of modulators $MOD_0$ to $MOD_{N-1}$ maps input symbol data sym on a complex plane by using quadrature amplitude modulation (QAM) or phase shift keying (PSK). Complex data $X_0$ to $X_{N-1}$ obtained by mapping is input to an inverse discrete Fourier transformer 14 and converted into waveform data on a time axis. A real part Re and an imaginary part Im of digital waveform data obtained by inverse fast Fourier transform (IFFT) are converted into analog in-phase signal I(t) and quadrature signal Q(t) by D/A converters 16, 18, respectively. An analog quadrature modulator 19 modulates a carrier signal having a carrier frequency $f_C$ by using the outputs I(t), Q(t) of the D/A converters 16, 18 as modulation signals, and synthesizes them to generate an RF transmission signal s(t). Note that in this description, insertion and removal of guard intervals are omitted.

A demodulator 20 will be described with reference to FIG. 1B. A received signal r(t) of the received carrier frequency $f_C$ is down-converted by an analog quadrature demodulator 22 into the in-phase signal I(t) and the quadrature signal Q(t). A/D converters 28, 30 convert the signals I(t), Q(t) that has passed through anti-aliasing filters 24, 26 into digital waveform data Di(t), Dq(t).

A discrete Fourier transformer 32 transforms data of one symbol length of the waveform data Di(t), Dq(t) into complex data (spectral data) $Y_0$ to $Y_{N-1}$ in the frequency domain by fast Fourier transform (FFT). Complex data $Y_\#$ corresponds to complex data $X_\#$ of the subcarrier having the frequency $f_\#$ in the modulator 10 of FIG. 1A. A plurality of demodulators $DEMOD_0$ to $DEMOD_{N-1}$ inversely map the complex data $Y_0$ to $Y_{N-1}$ of the corresponding subcarriers to symbol data $sym_0$ to $sym_{N-1}$. A parallel-serial converter 34 converts the plurality of pieces of symbol data $sym_0$ to $sym_{N-1}$ into serial data s[n].

An RF signal analyzer is used to test an RF device including the modulator 10 of FIG. 1A. The RF signal analyzer evaluates an RF signal generated by the RF device and is also referred to as a vector signal analyzer (VSA).

For example, in the next-generation (5G) mobile communication system, a carrier frequency of 28 GHz and a baseband bandwidth of 800 MHz are planned to be adopted. In the next-generation wireless LAN (IEEE802.11ad(Wi-Gig)), a carrier frequency of 60 GHz and a baseband bandwidth of 2 GHz are planned to be adopted.

When designing the RF signal analyzer on the basis of the architecture of the demodulator 20 of FIG. 1B, the A/D converters 28, 30 are required to have a band of several hundred MHz to several GHz. Wideband A/D converters generally have low resolution.

In the case of the demodulator 20 installed in the RF device, the A/D converters 28, 30 only need to have resolution that can demodulate the received signal, that is, can correctly determine the symbol. Even in the RF signal analyzer, as long as the symbol is determined and the bit error rate is measured, the accuracy the same as that of the RF device is sufficient. However, when measuring error vector magnitude (EVM) with an RF signal analyzer, the A/D converter is required to have sufficiently high accuracy. A wide band and highly accurate A/D converter has a problem that there are few options, and the test cost increases because it is very expensive. Note that such a problem may occur not only in the OFDM system but also in the test of the RF device that complies with other communication systems.

SUMMARY

A certain aspect of the present disclosure relates to a front-end circuit used to test an RF signal from a device under test. The RF signal is generated by modulating a carrier signal having a carrier frequency $f_C$ with a wideband baseband signal. The front-end circuit includes: a variable frequency oscillator that generates a local signal having a variable local frequency $f_{LO1}$; a first frequency mixer that frequency-mixes a local signal and an RF signal, and generates an intermediate frequency signal having a frequency $f_C$-$f_{LO1}$; and a band-pass type first filter that filters the intermediate frequency signal. The front-end circuit is configured to be able to supply a baseband signal based on the intermediate frequency signal that has passed through the first filter to a digitizer. The local frequency $f_{LO1}$ can be selected from a plurality of frequencies $f_0, f_1, f_2, \ldots$ having a frequency interval $\Delta f$ equal to or narrower than a bandwidth BW of the first filter.

Note that any combination of the above-described constituent elements and constituent elements and expressions of the present disclosure that are mutually replaced among methods, devices, and the like are also effective as an aspect of the present disclosure.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Figure 1A:
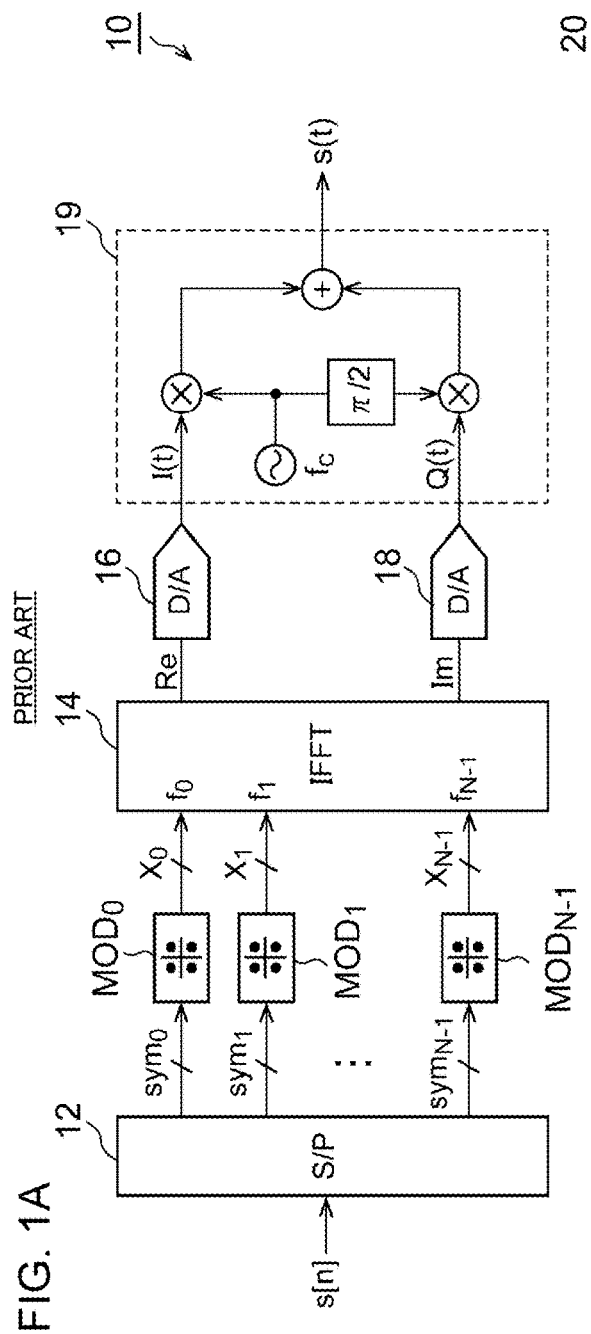
FIG. 1A and FIG. 1B are block diagrams of an OFDM modulator and demodulator.
Figure 1B:
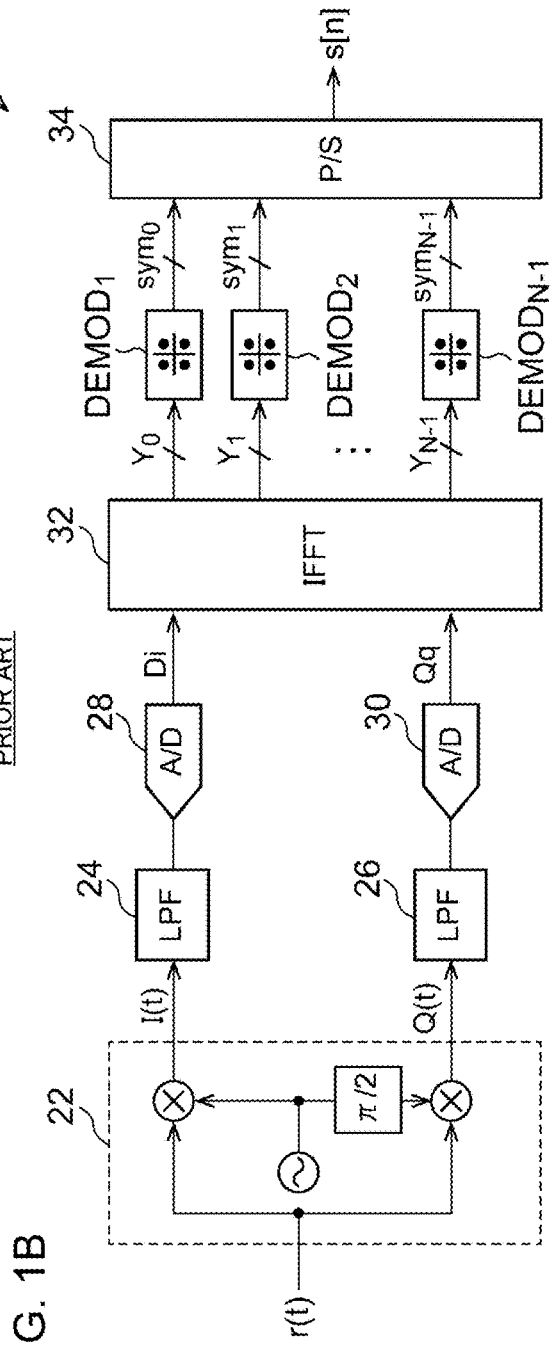

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

One embodiment disclosed herein relates to a front-end circuit used to test an RF signal from a device under test. The RF signal is generated by modulating a carrier signal having a carrier frequency $f_C$ with a wideband baseband signal. The RF signal can be, but is not limited to, an OFDM signal. The front-end circuit includes: a variable frequency oscillator that generates a local signal having a variable local frequency $f_{LO1}$; a first frequency mixer that frequency-mixes a local signal and an RF signal, and generates an intermediate frequency signal having a frequency $f_C$-$f_{LO1}$; and a bandpass type first filter that filters the intermediate frequency signal. The front-end circuit is configured to be able to supply a baseband signal based on the intermediate frequency signal that has passed through the first filter to a digitizer. The local frequency $f_{LO1}$ can be selected from a plurality of frequencies $f_0, f_1, f_2, \ldots$ having a frequency interval $\Delta f$ equal to or narrower than a bandwidth BW of the first filter.

When the local frequency $f_{LO1}$ is changed in time division as a plurality of frequencies $f_0, f_1, f_2 \ldots$, the center frequency $f_{IF}$ of the intermediate frequency signal changes as $f_C$-$f_0$, $f_C$-$f_1$, $f_C$-$f_2$ . . . . By passing this intermediate frequency signal through a bandpass filter having a predetermined bandwidth BW, the original wideband baseband signal can be cut out for each frequency channel (subband) with the bandwidth BW as a unit. Therefore, the frequency band of the signal input to the digitizer can be narrowed, and the digitizer with a narrow band and high accuracy can be used.

A scan interval $\Delta f$ of the local frequency $f_{LO1}$ may be narrower than the bandwidth BW of the first filter. The wideband baseband signal may include a plurality of subcarriers. At least one of the plurality of subcarriers may be included in common in the output of the first filter when $f_{LO1}=f_k (k=0, 1, 2, \ldots)$ and the output of the first filter when $f_{LO1}=f_{k+1}$. This enables band correction on the basis of information obtained for the same subcarrier.

The front-end circuit may further include a second frequency mixer that down-converts the intermediate frequency signal, and a second filter that filters an output of the second frequency mixer. The baseband signal may correspond to the output of the second filter.

The front-end circuit may provide a test system with a digitizer and a computer. The digitizer converts the output of the front-end circuit into digital waveform data. The computer processes the waveform data obtained by the digitizer.

The computer may perform the processing below.

Converting the waveform data $DW_0, DW_1, DW_2 \ldots$ generated by the digitizer for each of the plurality of frequencies $f_0, f_1, f_2 \ldots$ of the local frequency $f_{LO1}$ into spectral data $DF_0, DF_1, DF_2 \ldots$ in the frequency domain.

Shifting spectral data $DF_0, DF_1, DF_2 \ldots$ on the frequency axis and synthesizing the spectral data $DF_0, DF_1, DF_2 \ldots$.

The computer may correct spectral data DF on the basis of the common subcarrier data included in the kth (k=0, 1, 2, . . . ) spectral data $DF_k$ and the k+1th spectral data $DF_{k+1}$. As a result, the frequency characteristics such as the frequency mixer, the filter, the transmission path and the like can be corrected.

The front-end circuit described above can be mounted on a test board. By using this test board in combination with an existing low-speed and highly accurate digitizer, wideband RF signals can be tested inexpensively and with high accuracy.

Embodiment

Hereinafter, some embodiments will be described with reference to the drawings. The same or equivalent constituent elements, members, and processes shown in each drawing are denoted by the same reference numerals, and duplicated description will be appropriately omitted. Further, the embodiments are merely examples and do not limit the disclosure, and all features and combinations thereof described in the embodiments are not necessarily essential to the disclosure.

In the present specification, "the state in which the member A is connected to the member B" includes, in addition to the case where the members A and B are physically directly connected, the case where the members A and B are indirectly connected through another member that does not substantially affect the electrical connection state of the members A and B or does not impair the functions and effects exerted by their connection.

Similarly, "the state in which the member C is provided between the member A and the member B" includes, in addition to the case where the members A and C or the members B and C are directly connected, the case of indirect connection through another member that does not substantially affect the electrical connection state of the members or does not impair the functions and effects exerted by their connection.

Figure 2:
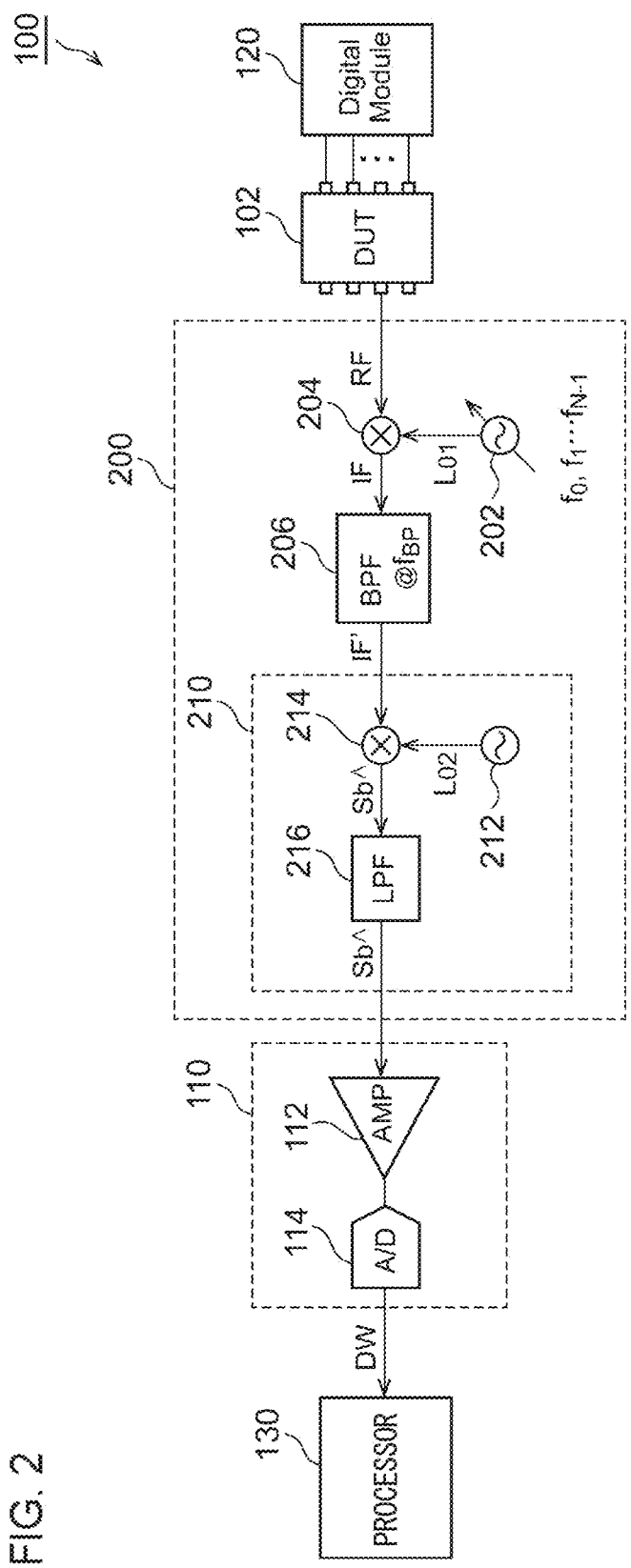
FIG. 2 is a block diagram showing the basic architecture of a test system according to an embodiment.

FIG. 2 is a block diagram showing the basic architecture of a test system 100 according to an embodiment. The test system 100 evaluates and analyzes a radio frequency (RF) signal generated by an RF device 102 that is a device under test. The RF signal is generated by modulating a carrier signal having a carrier frequency $f_C$ with a wideband baseband signal Sb(t). Although not limited thereto, the present disclosure is particularly useful in a communication system in which the band of the baseband signal exceeds 1 GHz. Although not limited thereto, the present disclosure is particularly useful in the millimeter wave band where the carrier frequency $f_C$ is several tens GHz.

In this test system 100, the RF signal is divided into a plurality N of subbands $FCH_0$ to $FCH_{N-1}$ when viewed in the frequency domain. Then, the plurality of subbands $FCH_0$ to $FCH_{N-1}$ are individually captured in a time division manner.

The test system 100 includes a digitizer 110, a digital module 120, a processor 130 and a front-end circuit 200.

The digital module 120 is connected to the RF device 102 and controls the RF signal generated by the RF device 102.

The digitizer 110 converts an analog input signal into a digital signal. The digitizer 110 includes, for example, an amplifier 112 and an A/D converter 114. The front-end circuit 200 is provided between the digitizer 110 and the RF device 102, and serves as an interface with the RF device 102 in the test system 100.

The processor 130 is a part of a computer and processes the digital waveform data generated by the digitizer 110 by executing a software program. Note that part of the processing of the processor 130 may be performed by hardware processing instead of software.

The front-end circuit 200 includes a variable frequency oscillator 202, a first frequency mixer 204, a first filter 206, and a frequency converter 210.

The variable frequency oscillator 202 generates a first local (LO1) signal having a variable local frequency $f_{LO1}$ (<$f_C$). The first frequency mixer 204 frequency mixes the LO1 signal and the RF signal to generate an intermediate frequency (IF) signal having a frequency $f_C$-$f_{LO1}$.

The first filter 206 is a bandpass filter that receives an IF signal and passes a component in a predetermined frequency range included in the IF signal. The bandwidth BW of the first filter 206 defines the bandwidth of the subband FCH. When the center frequency of the first filter 206 is $f_{BP}$, the output IF' of the first filter 206 includes the components in the frequency range $f_{BP}$-BW/2 to $f_{BP}$+BW/2 of its input IF. As will be described later, the bandwidth BW of the first filter 206 defines the bandwidth of the signal input to the digitizer 110, so that the bandwidth BW is designed on the basis of the bandwidth of the digitizer 110 (that is, the sampling rate $f_s$ of the A/D converter 114). More specifically, BW×2<$f_s$ must be satisfied according to the sampling theorem, and therefore, it is sufficient that the design is made such that BW<$f_s$/2. For example, when the 500 Msps A/D converter 114 is adopted, the bandwidth BW may be narrower than 250 MHz, and may be 200 MHz, for example.

The frequency converter 210 receives the IF' signal that has passed through the first filter 206 and converts the IF' signal to a narrowband baseband signal Sb^ having an optimum frequency for processing by the digitizer 110 in the subsequent stage. The narrowband baseband signal Sb^ includes a frequency component of one subband in the baseband signal Sb(t) used for generating the RF signal.

The frequency converter 210 includes an oscillator 212, a second frequency mixer 214, and a second filter 216. The second frequency mixer 214 frequency-mixes the IF' signal that has passed through the first filter 206 with a second local (LO2) signal generated by the oscillator 212, and down-converts into a lower frequency domain. The frequency $f_{LO2}$ of the local signal LO2 is determined so that the output Sb^ of the second frequency mixer 214 does not include a negative frequency component. More specifically, it is sufficient that the relationship of $f_{BP}$-BW/2-$f_{LO2}$>0 is satisfied, and $f_{BP}$-BW/2>$f_{LO2}$ is satisfied.

The second filter 216 is an anti-aliasing filter, removes a radio frequency component of the baseband signal Sb^ that is an output from the second frequency mixer 214, and provides the result to the digitizer 110. The second filter 216 may be designed as a low pass filter or a band pass filter.

In the variable frequency oscillator 202, the local frequency $f_{LO1}$ can be selected from a plurality of frequencies $f_0$, $f_1$, . . . . An interval Δf between the plurality of frequencies $f_0$, $f_1$, . . . is equal to or narrower than the bandwidth BW of the first filter 206.

The above is the configuration of the test system 100. Next, the operation of the test system 100 will be described on the basis of some embodiments.

First Embodiment

Figure 3:
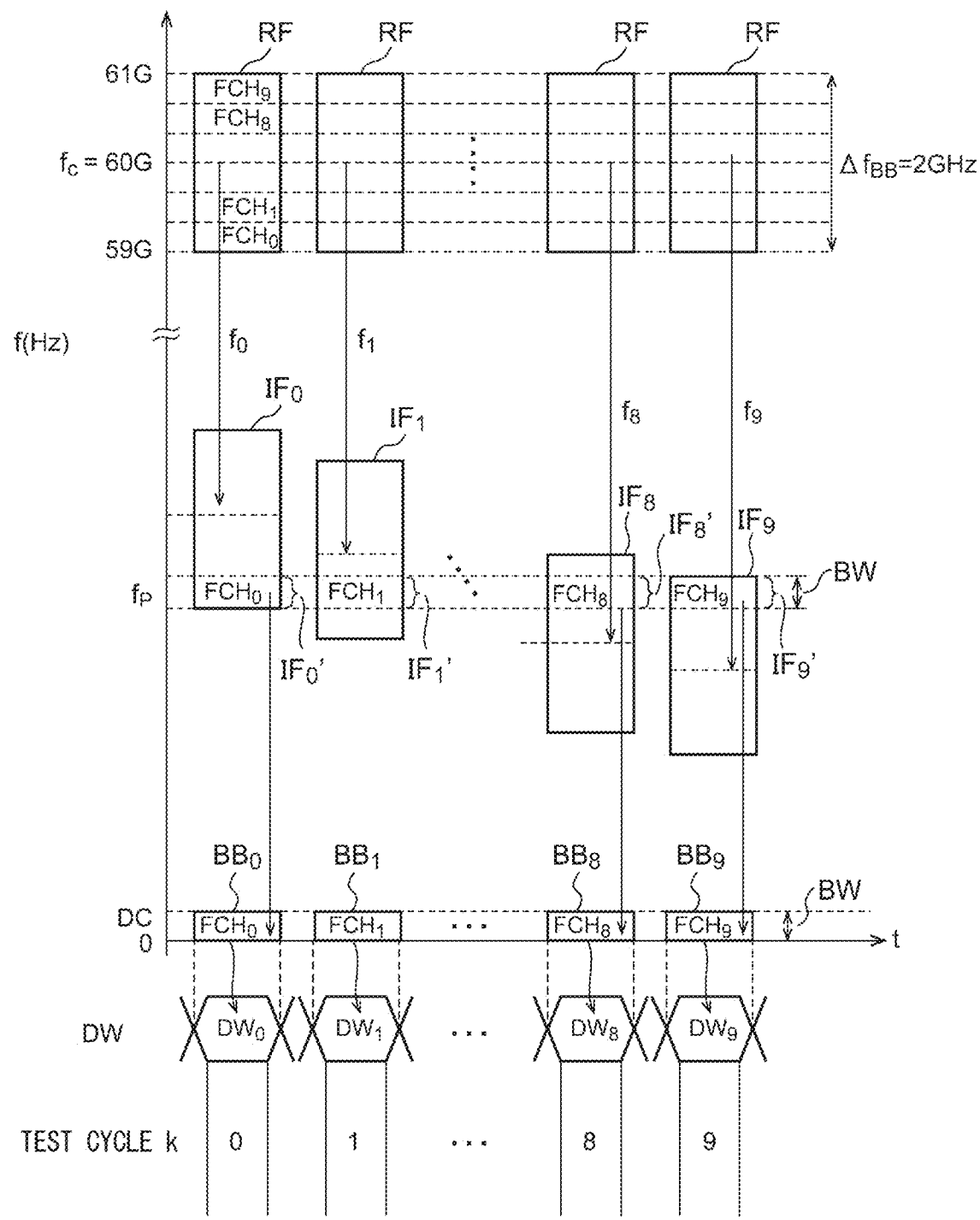
FIG. 3 is a diagram for explaining operation of a front-end circuit and a digitizer of the test system in FIG. 2.

FIG. 3 is a diagram for explaining operation of the front-end circuit 200 and the digitizer 110 of the test system 100 in FIG. 2. A vertical axis represents frequency and the horizontal axis represents time. The RF device 102 repeatedly generates an RF signal for each test cycle k (k=0, 1 . . . N-1). Each RF signal is preferably the same signal based on the same serial signal, but the disclosure is not limited to this, and different serial signals may be used. In this example, the carrier frequency $f_C$=60 GHz, and the bandwidth $\Delta f_{BB}$ of the baseband signal is 2 GHz. The center frequency $f_{BP}$ of the pass band of the first filter 206 is not particularly limited, but in consideration of availability of the filter, it is preferable to adopt a filter of 2 GHz band or 5 GHz band. For example, a filter with $f_{BP}$=2.14 GHz and pass bandwidth BW=200 MHz can be used. In this case, the RF signal is divided into 2 GHz/200 MHz=10 subbands $FCH_0$ to $FCH_9$.

The variable frequency oscillator 202 shifts the frequency $f_{LO1}$ of the local signal LO1 at intervals of Δf for each test cycle. Specifically, the local frequency $f_k$ in the kth (k=0, 1, 2, . . . 8, 9) test cycle is determined so that the kth subband $FCH_k$ passes through the first filter 206. In this embodiment, a shift amount Δf is 200 MHz, which is equal to the bandwidth BW.

The frequency of the LO2 signal generated by the oscillator 212 may be equal to the pass frequency $f_{BP}$ of the first filter 206. As a result, the second frequency mixer 214 down-converts the output IF' of the first filter 206 into the baseband signal Sb^ in the frequency domain near DC. The baseband signal $Sb_k$^ obtained in the kth test cycle corresponds to the kth subband $FCH_k$.

In each test cycle k, the narrowband baseband signal $Sb_k\char`\^$ that has passed through the second filter 216 is converted into digital waveform data DW. When 10 test cycles are completed, the digitizer 110 acquires the waveform data $DW_0$ to $DW_9$ corresponding to all the subbands $FCH_0$ to $FCH_9$.

The above is the operation of the front-end circuit 200 and the digitizer 110. According to this front-end circuit 200, the RF signal modulated by the wideband baseband signal is divided into a plurality of subbands, and the digitizer 110 takes in each subband. As a result, the band required for the A/D converter 114 can be narrowed, and an inexpensive and highly accurate A/D converter can be adopted.

In this front-end circuit 200, only the first frequency mixer 204 needs to be designed to operate in the bandwidth of 2 GHz, and the bandwidth of the circuit block (the first filter 206, the second frequency mixer 214, the second filter 216) in the subsequent stage may be narrow, so that it is easy to design.

In addition, the signal handled by the frequency converter 210 has a narrow bandwidth and a constant center frequency ($f_{BP}$). Therefore, the design of the frequency converter 210 is also easy in that respect, which is a great advantage.

Next, the operation of the processor 130 of the test system 100 will be described.

Figure 4:
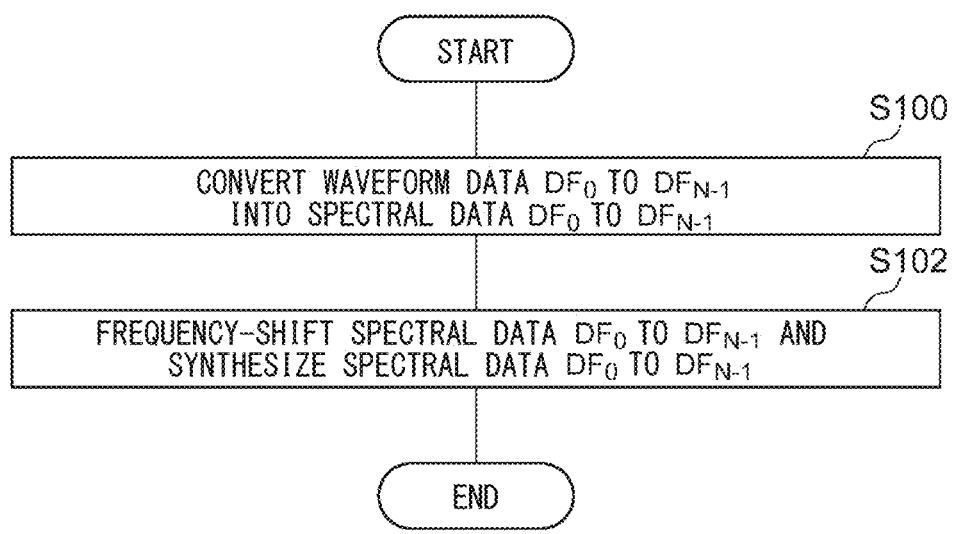
FIG. 4 is a flowchart showing operation of a processor.

FIG. 4 is a flowchart showing operation of the processor 130. The processor 130 converts the waveform data $DW_0$, $DW_1$, $DW_2$ ... generated by the digitizer 110 for each of the plurality of frequencies $f_0$, $f_1$, $f_2$ ... of the local frequency $f_{LO1}$ into spectral data $DF_0$, $DF_1$, $DF_2$ ... in the frequency domain (S100). A fast Fourier transform (FFT) algorithm can be used for this conversion.

Then, the processor 130 shifts the spectral data $DF_0$, $DF_1$, $DF_2$ ... on the frequency axis, synthesizes the shifted spectral data $DFs_0$, $DFs_1$, $DFs_2$ ... in the frequency domain, and reconstructs the spectral (frequency information) of the original wideband baseband signal (S102). The synthesis here is understood as the binding of sequences.

Figure 5:
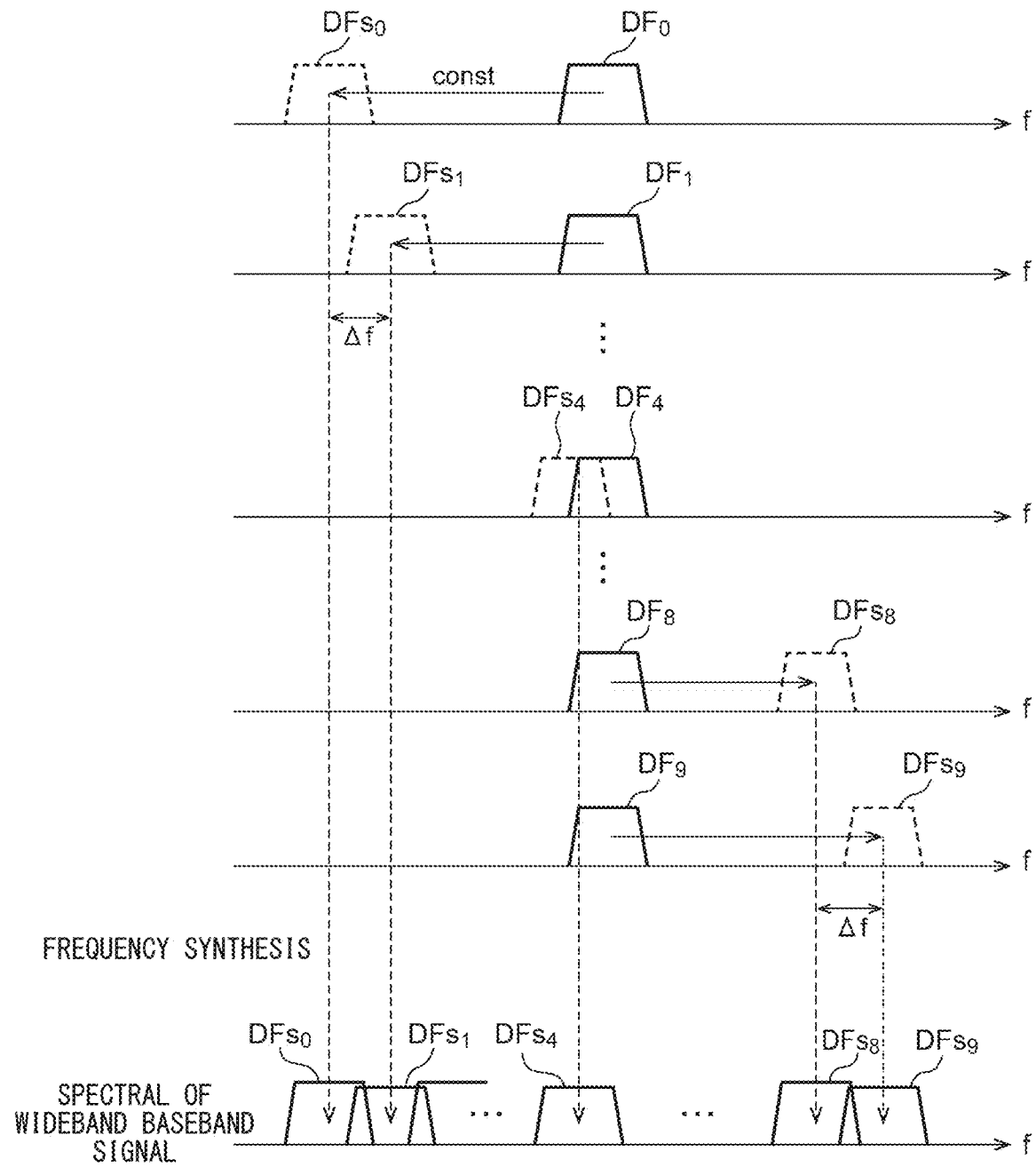
FIG. 5 is a diagram for explaining synthesis of a plurality of pieces of spectral data in a frequency domain.

FIG. 5 is a diagram for explaining synthesis of spectral data in the frequency domain. The shift amount on the frequency axis of the i-th (i=0, 1, 2 ...) spectral data $DF_i$ is represented by $\Delta f \times i + const$. The const may be determined so that the center frequency of the spectral of the original baseband signal Sb(t) is 0 Hz.

According to this processing, the spectral of the original baseband signal Sb(t) can be acquired. The waveform of the baseband signal can be reproduced by performing an inverse discrete Fourier transform (IDFT) on the spectral of the baseband signal.

Second Embodiment

In the first embodiment, the interval $\Delta f$ of the local frequency $f_{LO1}$ is set to be equal to the bandwidth BW of the first filter 206. On the other hand, in the second embodiment, the scan interval $\Delta f$ of the local frequency $f_{LO1}$ is narrower than the bandwidth BW of the first filter 206. That is, in the kth test cycle and the k+1th test cycle, a part of the spectral of the original baseband signal is captured in an overlapping manner. In this specification, this overlapping band (called overlap band OB) is used for inter-channel calibration.

The wideband baseband signal includes a plurality of subcarriers Sc, and each subband FCH also includes a plurality (X) of subcarriers Sc. The output $IF_k'$ of the first filter 206 when $f_{LO1}=f_k$ (k=0, 1, 2, ...) and the output $IF_{k+1}'$ of the first filter 206 when $f_{LO1}=f_{k+1}$ commonly include at least one of the X subcarriers Sc, and therefore the spectral data $DF_k$, $DF_{k+1}$ (or $DFs_k$, $DFs_{k+1}$) also includes information of the common subcarrier Sc.

Spectral data measured on the same subcarrier Sc should essentially match. Therefore, the processor 130 uses the values of the common subcarriers included in the respective overlapping bands of the two pieces of adjacent spectral data $DFs_k$, $DFs_{k+1}$ (k=0, 1, 2 ... ), and at least one of the pieces of spectral data $DFs_k$, $DFs_{k+1}$ is corrected (called band correction processing).

Figure 6:
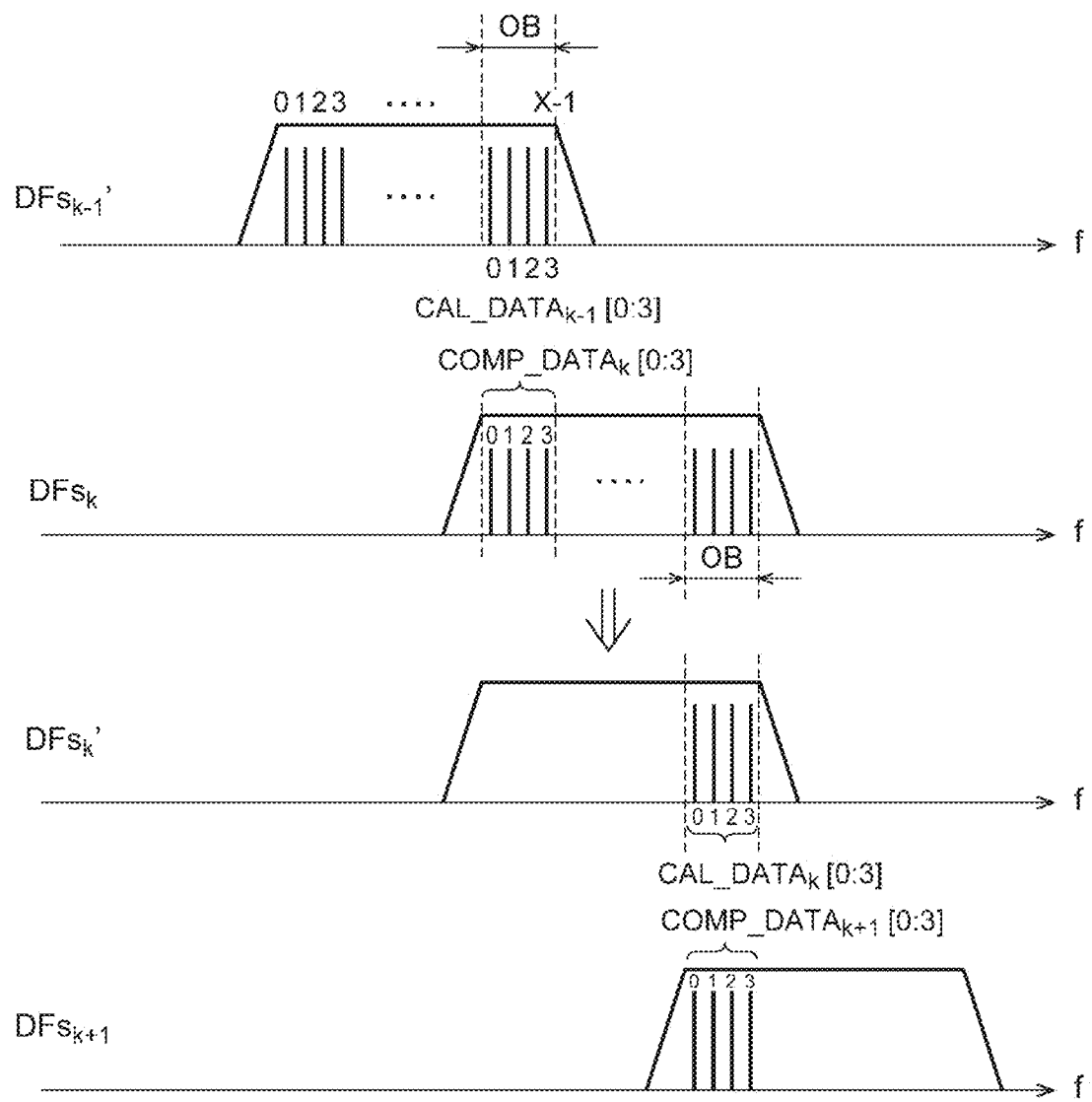
FIG. 6 is a diagram for explaining band correction processing according to a second embodiment.

FIG. 6 is a diagram for explaining band correction processing according to the second embodiment. FIG. 6 shows three pieces of spectral data $DFs_{k-1}$, $DFs_k$, $DFs_{k+1}$ that are adjacent in the frequency domain.

When X subcarriers $Sc_0$ to $Sc_{X-1}$ are included in the spectral data $DFs_\#$, the spectral data will be array data with the subcarrier Sc number as an index, and can be represented as $DF_\#'[0:X-1]$.

The k-th spectral data $DFs_k$ is the target of band correction. $DFs'_{k-1}$ represents spectral data that has already been band-corrected. The rightmost Y elements $DFs_{k-1}[X-Y:X-1]$ of $DFs'_{k-1}$ are set as $CAL\_DATA_{k-1}[0:Y-1]$. Y is the number of subcarriers included in the overlap band, and Y=4 in FIG. 6. The leftmost Y elements $DFs_k[0:Y-1]$ of $DFs_k$ are set as $COMP\_DATA_k[0:Y-1]$.

The correction coefficient array COEFF[0:Y−1] is generated using the two arrays $CAL\_DATA_{k-1}[0:Y-1]$ and $COMP\_DATA_k[0:Y-1]$. The element COEFF[j] of the correction coefficient array COEFF[0:Y−1] is expressed by equation (1).

$$COEFF[j]=CAL\_DATA[j]/COMP\_DATA[j] \quad (1)$$

The spectral data $DFs_k$ is corrected on the basis of this correction coefficient array. The corrected spectral data is referred to as $DFs_k'$. The rightmost Y elements $DFs_k'[X-Y:X-1]$ of $DFs_k'$ become $CAL\_DATA_k[0:Y-1]$ and are used for band correction of the next spectral data $DFs_{k+1}$.

Figure 7:
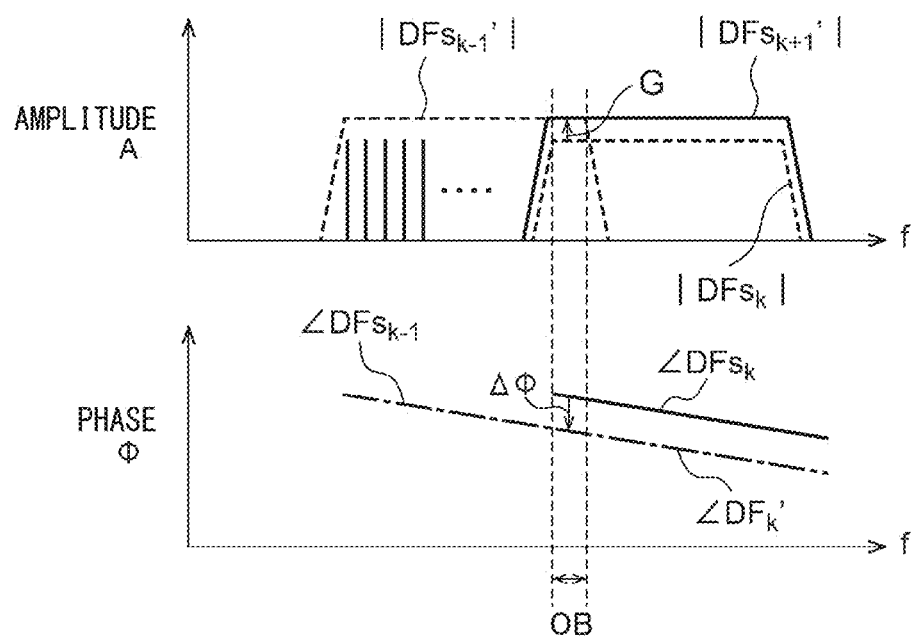
FIG. 7 is a diagram for explaining band correction of spectral data DFs.

FIG. 7 is a diagram for explaining band correction of spectral data $DFs_k$. The spectral data $DFs_k$ obtained by the discrete Fourier transform is a complex number and includes amplitude information and phase information (or real part and imaginary part). $|DF_k'|$ represents the amplitude of $DF_k'$ and $\angle DF_k'$ represents the phase of $DF_k'$. The amplitude correction amount $\Delta A$ can be calculated from the difference between the amplitudes of the overlapping subcarriers, and specifically, can be calculated from the absolute value |COEFF[j]| of the correction coefficient array.

For example, the average value of |COEFF[j]| is calculated for Y subcarriers and used as the correction coefficient G. By multiplying this correction coefficient G by |DFs|, |DFs'| can be obtained.

Similarly, the phase correction amount $\Delta\varphi$ can be calculated from the phase difference between the overlapping subcarriers, and specifically, can be calculated from the deviation angle $\angle COEFF[j]$ of the correction coefficient array. Similarly for the phase, the average value of $\angle COEFF[j]$ is calculated for Y subcarriers, and is set as the correction amount $\Delta\varphi$.

$$\angle DFs'=\angle DFs+\Delta\varphi \quad (2)$$

can be established.

Note that, regarding the phase, if the same correction amount $\Delta\varphi$ is applied to all X subcarriers, correct correction may not be possible in some cases. In this case, $\angle COEFF[0:Y-1]$ may be extrapolated to calculate $\Delta\varphi[0:X-1]$. The least square method (LSM) or the like can be used for this interpolation.

$$\angle DFs[j]'=\angle DFs[j]+\Delta\varphi[j] \quad (2')$$

Band correction can be performed by equation (3).

$$DFs' = G \cdot \exp\{i \times \Delta\varphi[j]\} \times DFs \quad (3)$$

Figure 8:
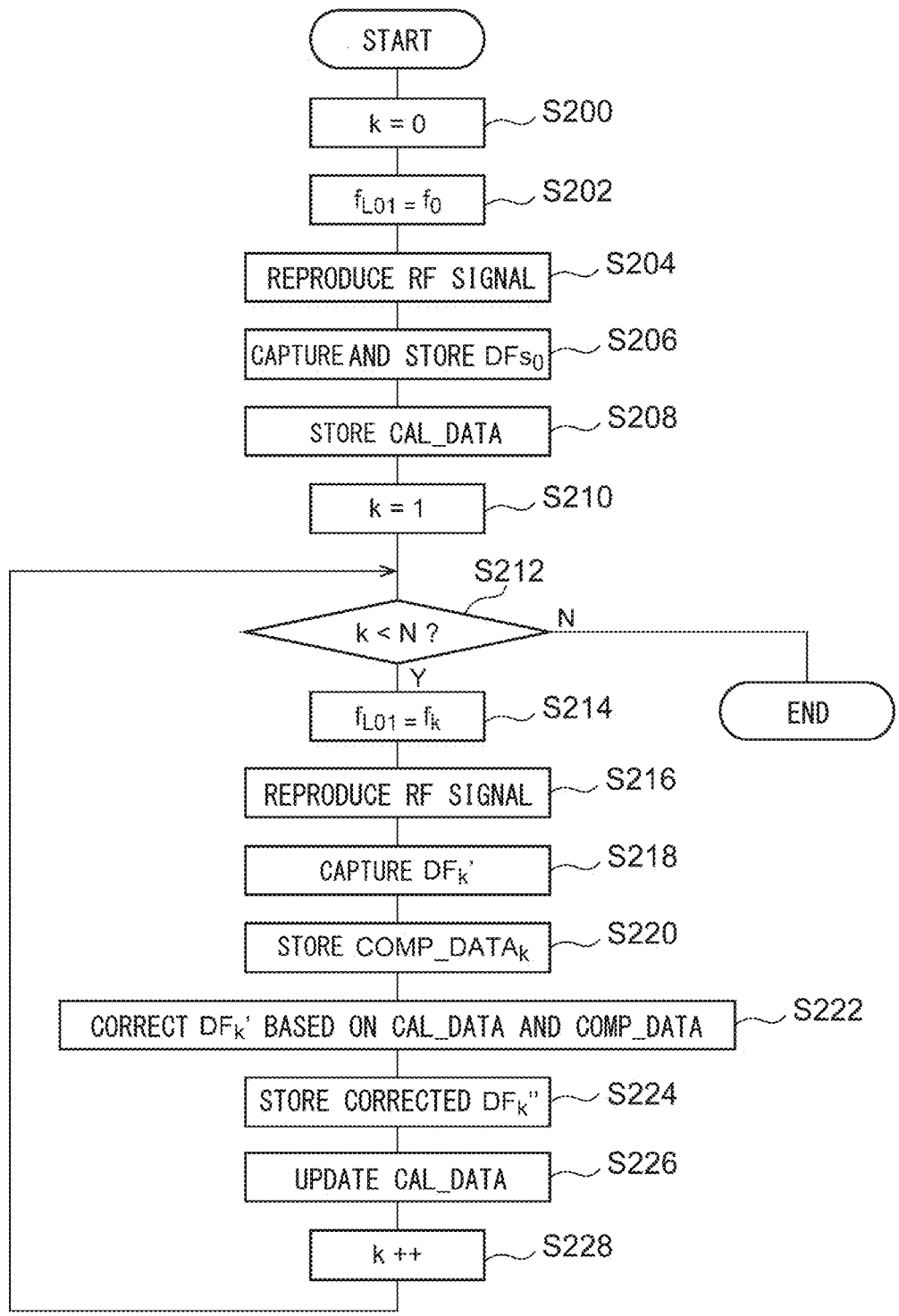
FIG. 8 is a flowchart for explaining processing of the second embodiment of the processor.

FIG. 8 is a flowchart for explaining processing of the second embodiment of the processor 130. Here, a case of dividing into N subbands will be described.

The test cycle k is initialized (k=0, S200). Then, the local frequency $f_{LO1}$ is set to $f_0$ (S202), and the RF device 102 reproduces the RF signal on the basis of the predetermined baseband signal (S204). As a result, the spectral data $DFs_0$ of the 0th subband $FCH_0$ is captured. (S206). Band correction is omitted for this subband $FCH_0$. The element on the radio frequency side of the spectral data $DFs_0$ is stored as $CAL\_DATA_0$ (S208).

Then, the test cycle k is set to 1 (S210). Then, while k<N is satisfied (Y in S212), the following process is repeated while incrementing k (S228).

Then, the local frequency $f_{LO1}$ is set to $f_k$ (S214), and the RF device 102 reproduces the RF signal on the basis of the predetermined baseband signal (S216). As a result, the spectral data $DFs_k$ of the kth subband $FCH_k$ is captured (S218). The element on the low frequency side of the spectral data $DFs_k$ is stored as $COMP\_DATA_k$ (S220).

On the basis of $CAL\_DATA_{k-1}$ obtained in the previous test cycle k-1 and $COMP\_DATA_k$ obtained in the current test cycle k, $DFs_k$ is band-corrected (S222) and the corrected $DFs_k'$ is stored (S224). The element on the radio frequency side of $DFs_k'$ is stored as a new $CAL\_DATA_k$ (S226).

When k=N (N in S212), the process ends. By this processing, all frequency bands can be corrected.

Third Embodiment

In the test system 100 of FIG. 2, not only the filters 206, 216 but also the first frequency mixer 204, the second frequency mixer 214, or the transmission line have frequency characteristics. Therefore, prior to the measurement, the transfer functions $H_0(f)$ to $H_{N-1}(f)$ of the subbands $FCH_0$ to $FCH_{N-1}$ of the test system 100 may be obtained in advance. The transfer functions $H_0(f)$ to $H_{N-1}(f)$ can be obtained by measuring an S parameter ($S_{21}$) from the input end to the output end of the front-end circuit 200 with a network analyzer. Alternatively, the transfer function may be estimated by simulation.

Then, the spectral data $DF_k$ (or $DFs_k$) is corrected using the corresponding transfer function $H_k(f)$. For example, the spectral data $DF_k$ can be appropriately corrected by multiplying it by the reciprocal $1/H_k(f)$ of $H_k(f)$.

As a result, it is possible to cancel the difference in the transmission characteristics for each subband of the test system 100.

Figure 9:
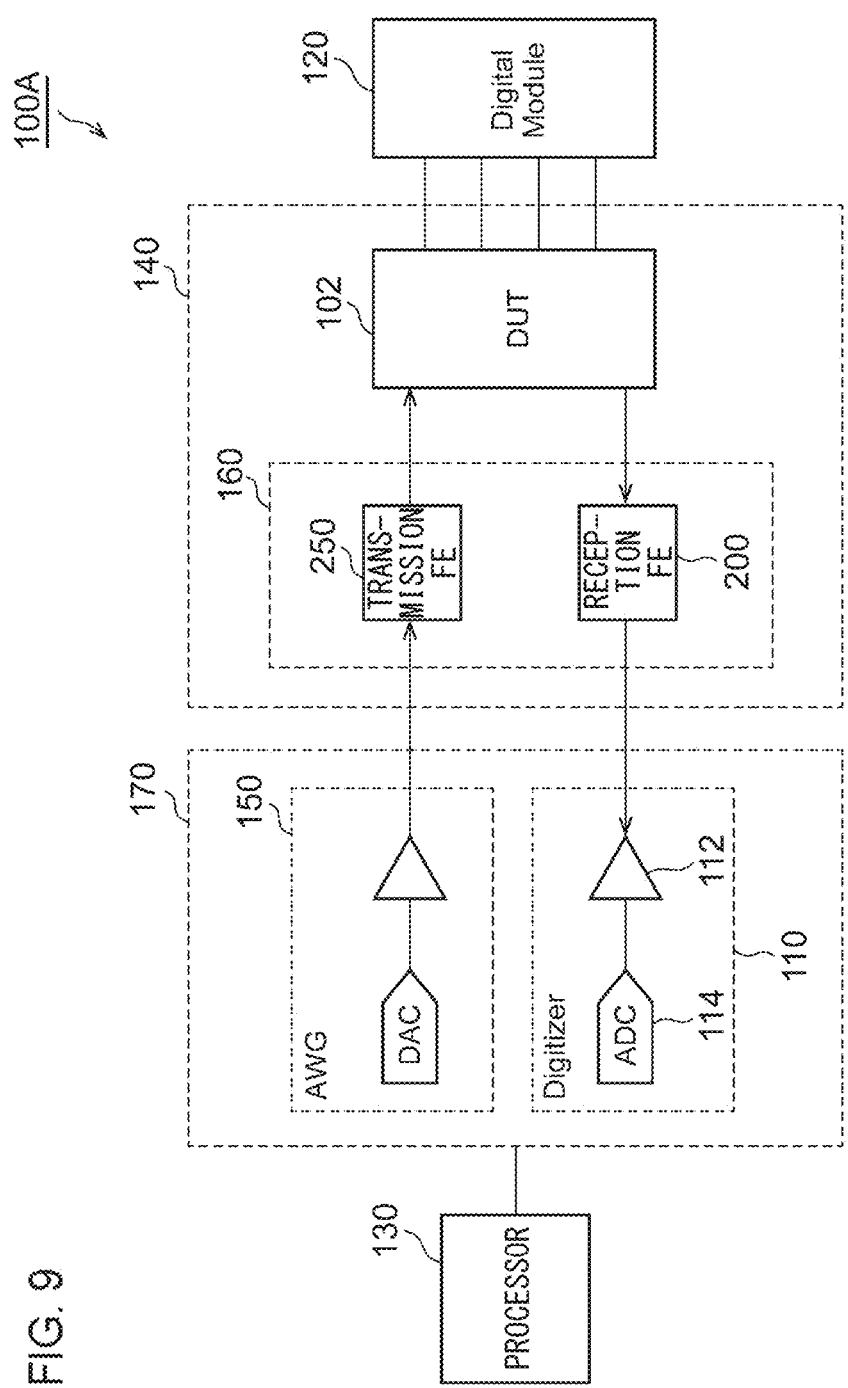
FIG. 9 is a block diagram showing an aspect of the test system.

Subsequently, a specific mode of the test system 100 will be described. FIG. 9 is a block diagram showing an aspect (100A) of the test system 100. A measuring instrument 170 is an existing hardware resource originally owned by the user and includes the digitizer 110 and an arbitrary waveform generator 150.

By adding a millimeter wave build-off self-test (BOST) unit 160 to the measuring instrument 170, it becomes possible to evaluate a wideband RF signal exceeding the band of the digitizer 110. The millimeter wave BOST unit 160 is mounted on the test board 140 on which the RF device 102 is mounted. The millimeter wave BOST unit 160 includes a transmission-side front-end circuit 250 in addition to the reception-side front-end circuit 200 described above. The front-end circuit 250 modulates a radio frequency carrier using the baseband signal generated by the arbitrary waveform generator 150, and generates a transmission RF signal.

According to this test system 100A, the wideband RF signal can be evaluated by adding the test board 140 to the existing test system including the digitizer 110, the digital module 120, and the processor 130.

The embodiments have been described above. This embodiment is an example, and it is understood by those skilled in the art that various modifications can be made to the combinations of the respective constituent elements and the respective processing processes, and such modifications are also within the scope of the present disclosure. Hereinafter, such modifications will be described.

First Modification

Figure 10:
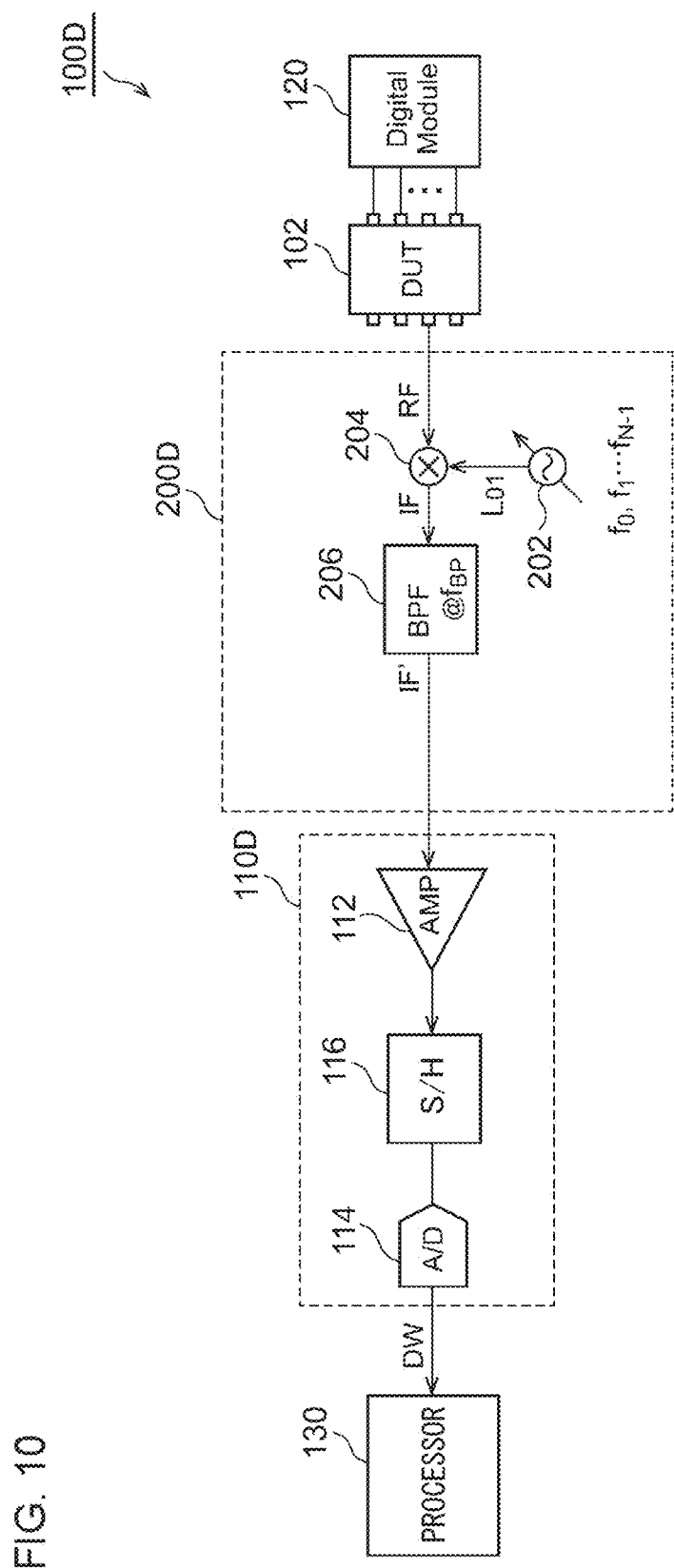
FIG. 10 is a block diagram of a test system according to a first modification.

FIG. 10 is a block diagram of a test system 100D according to a first modification. In this test system 100D, a front-end circuit 200D is the test system 100 of FIG. 2 from which the frequency converter 210 is omitted. Instead, a digitizer 110D is provided with a sample hold circuit 116 that is provided between the amplifier 112 and the A/D converter 114 and performs undersampling.

According to this modification, the A/D converter 114 and the amplifier 112 require a frequency sufficient to cover the modulation band. In exchange for that, the oscillator 212 and the second frequency mixer 214, and the second filter 216 which configure the frequency converter 210 can be omitted, and therefore, the number of components can be reduced. In particular, since the cutoff frequency of the second filter 216 is low, the size of the components forming the second filter 216 is large, and the effect of downsizing by omitting them is great.

Second Modification

Figure 11:
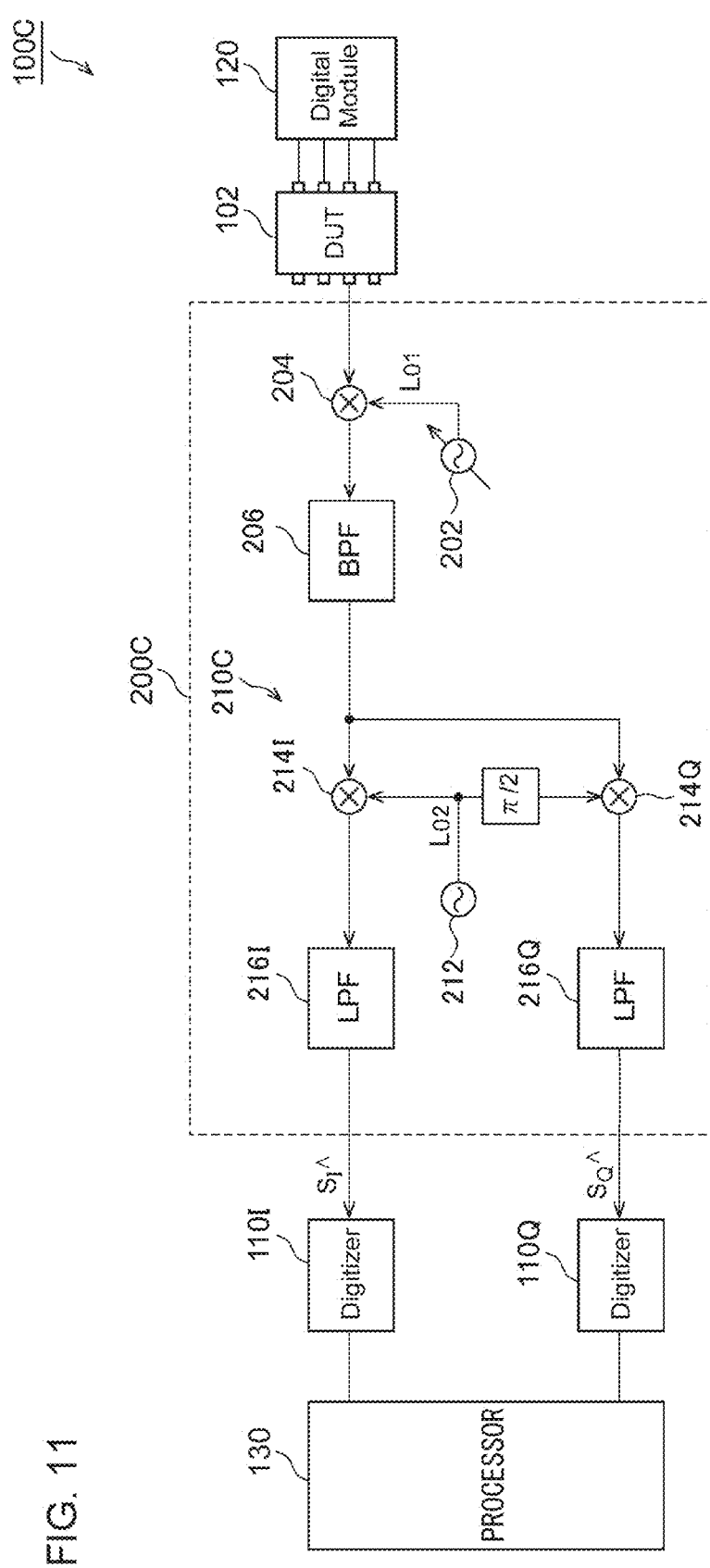
FIG. 11 is a block diagram of a test system according to a second modification.

FIG. 11 is a block diagram of a test system 100C according to a second modification. The basic configuration of the test system 100C is similar to that of FIG. 2, but the configuration of a frequency converter 210C is different. The frequency converter 210C includes second frequency mixers 214I, 214Q and second filters 216I, 216Q corresponding to the I component and the Q component.

IQ separation is performed in the analog domain by incorporating a quadrature demodulator in the frequency converter 210C. As a result, the band of the digitizers 110I, 110Q in the subsequent stage can be made half of that of the digitizer 110 in FIG. 2. As a result, a set of digitizers 110I, 110Q can capture a signal having a double bandwidth, so that the number of captures can be reduced by half. Alternatively, if the number of captures is not changed, a slower and higher resolution A/D converter (digitizer) can be adopted.

Third Modification

Figure 12:
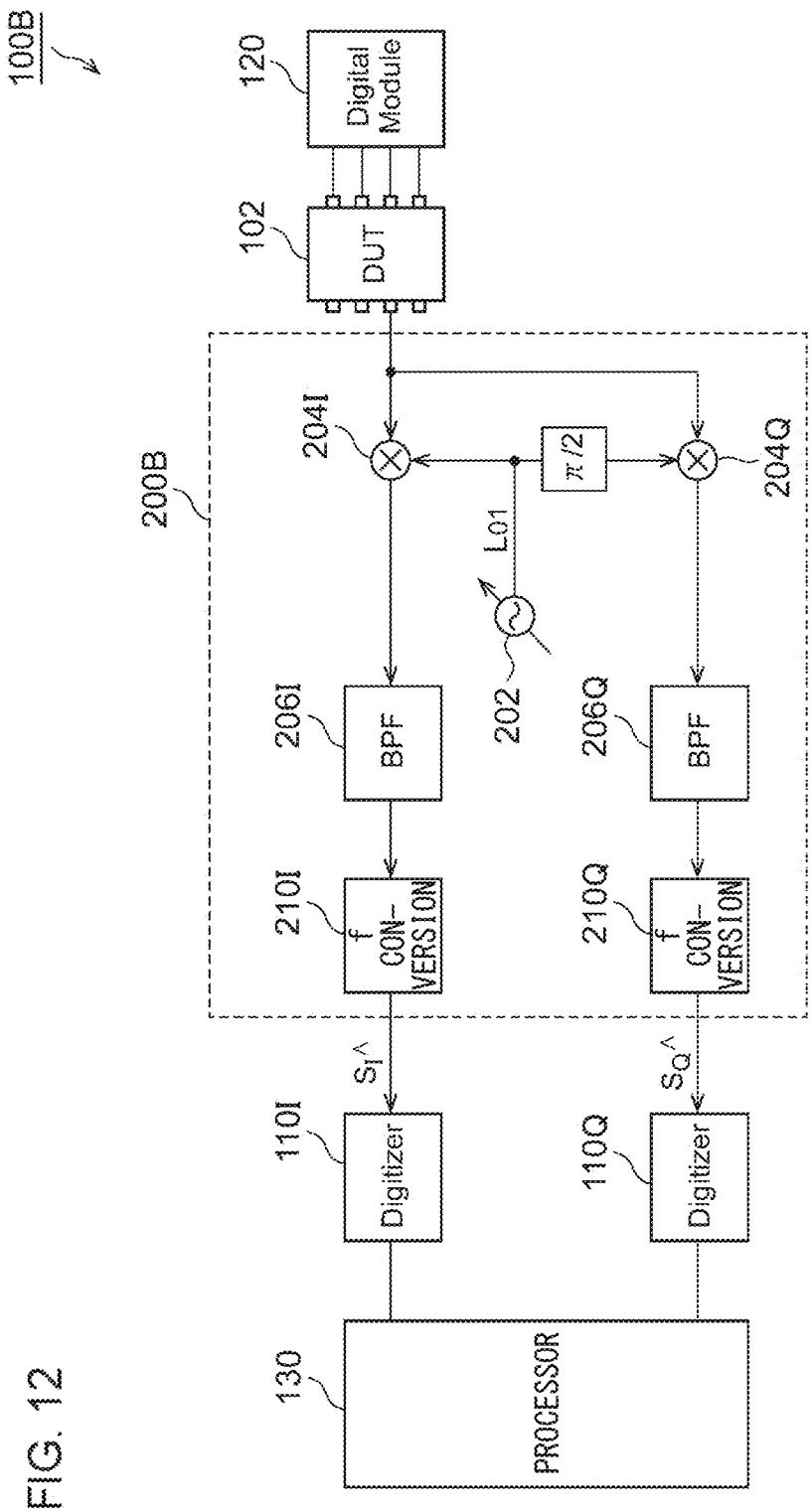
FIG. 12 is a block diagram of a test system according to a third modification.

FIG. 12 is a block diagram of a test system 100B according to a third modified example. A front-end circuit 200B includes a 90° phase shifter 220 and shifts the local signal LO1 by 90°. A first frequency mixer 204Q mixes the RF signal and the output of the phase shifter 220, and extracts the Q component of the RF signal. The output of a corresponding first frequency mixer 204# is input to a first filter 206# (#=I, Q). A frequency converter 210# receives the output of the corresponding first filter 206# and supplies the output $S_\#\hat{}$ to a digitizer 110#.

This makes it possible to process the baseband signals $S_I\hat{}$, $S_Q\hat{}$ in the form of complex numbers. One of the advantages of signal processing with a complex number is that it is possible to handle negative frequencies, and the frequency $f_{LO2}$ of the local signal LO2 can be determined such that the outputs $S_I\hat{}$, $S_Q\hat{}$ of the second frequency mixer 214 include negative frequency components. For example, when $f_{BP}=f_{LO2}$, the baseband signals $S_I\hat{}$, $S_Q\hat{}$ have a spectral centered on 0 Hz (DC). When the sampling rate of the A/D converter 114 is 500 Msps, the bandwidth of one subband can be expanded to 250 MHz.

Fourth Modification

The frequency converter 210 may be omitted and the frequency $f_{LO1}$ of the local signal LO1 may be increased to directly generate the baseband signal Sb$\hat{}$ in the frequency domain near DC by the first frequency mixer 204.

Fifth Modification

In the embodiments, the frequency $f_{LO1}$ of the local signal LO1 is increased in each test cycle, but the frequency is not limited to this, and the frequency of the local signal LO1 may be decreased in each test cycle, or may be changed in a random order.

Sixth Modification

In the embodiment, an example in which a plurality of subbands are synthesized in the frequency domain and the spectral of the baseband signal Sb(t) is measured has been described, but the present disclosure is not limited thereto. For example, the test system 100 can demodulate symbols included in an RF signal and measure EVM.

The case where the RF signal is an OFDM signal will be considered. In the test system 100 of FIG. 2, the processor 130 cuts out the waveform data DW for each subband for each symbol on the time axis. Then, the waveform data DW is converted into spectral data DF in the frequency domain and synthesized in the frequency domain as shown in FIG. 5. However, the center frequency of the wideband baseband signal after the synthesis is not DC but the IF frequency $f_{IF}$.

By digital signal processing, the synthesized wideband baseband signal is multiplied by $\cos(2\pi f I_F)$ and $-\sin(2\pi f I_F)$, and orthogonal demodulation is performed. This operation may be performed in the frequency domain or the time domain. Then, the original OFDM symbol can be demodulated by performing discrete Fourier transform on the obtained two signals as a real part and an imaginary part.

The EVM can be calculated based on the signal information (that is, the amplitude and the phase) obtained by the discrete Fourier transform and their expected values.

In the configuration of FIG. 12, since quadrature demodulation is performed by analog signal processing, the processor 130 divides the waveform data obtained by the digitizers 110I, 110Q for each symbol, and perform discrete Fourier transform on the obtained waveform data as a real part and an imaginary part, so that the original OFDM symbol can be demodulated. The EVM can be calculated based on the signal information (the amplitude and the phase) obtained by the discrete Fourier transform and their expected values.

Note that, in OFDM, a symbol is assigned to each subcarrier, but PILOT subcarriers for delay correction are required for demodulation, and PILOT subcarriers may be included in other subbands, so that it is preferable that demodulation is performed after synthesizing all subbands in the frequency domain. However, in the LSI test, if the delay fluctuation for each symbol can be ignored, the PILOT subcarrier is not necessary, so that demodulation can be performed independently for each subband without synthesizing the spectral data DF in the frequency domain.

The present disclosure is not limited to OFDM and is widely applicable to testing wideband RF signals.

What is claimed is:

1. A front-end circuit used for testing an RF signal from a device under test,
   the RF signal generated by modulating a carrier signal having a carrier frequency $f_C$ with a wideband baseband signal,
   the front-end circuit comprising:
   a variable frequency oscillator structured to generate a local signal having a variable local frequency $f_{LO1}$;
   a first frequency mixer structured to frequency-mix the local signal and the RF signal to generate an intermediate frequency signal having a frequency $f_C-f_{LO1}$; and
   a band-pass type first filter structured to filter the intermediate frequency signal,
   wherein the front-end circuit is structured to supply a baseband signal based on the intermediate frequency signal to a digitizer, and
   the local frequency $f_{LO1}$ can be selected from a plurality of frequencies $f_0, f_1, \ldots$ having a frequency interval $\Delta f$ equal to or narrower than a bandwidth BW of the first filter, wherein the frequency interval $\Delta f$ is narrower than the bandwidth BW of the first filter,
   the wideband baseband signal includes a plurality of subcarriers, and
   an output of the first filter when the local frequency $f_{LO1}$ is $f_k$ (k=0, 1, 2, ...) and an output of the first filter when $f_{LO1}$ is $f_{k-1}$ commonly include at least one of the plurality of subcarriers.

2. The front-end circuit according to claim 1, further comprising:
   a second frequency mixer structured to down-convert the intermediate frequency signal that has passed through the first filter; and
   a second filter structured to filter an output of the second frequency mixer,
   wherein the baseband signal corresponds to an output of the second filter.

3. A test board comprising the front-end circuit according to claim 1.

4. A front-end circuit used for testing an RF signal from a device under test, under test,
   the RF signal generated by modulating a carrier signal having a carrier frequency $f_C$ with a wideband baseband signal,
   the front-end circuit comprising:
   a variable frequency oscillator structured to generate a local signal having a variable local frequency $f_{LO1}$;
   a first frequency mixer structured to frequency-mix the local signal and the RF signal to generate an intermediate frequency signal having a frequency $f_C-f_{LO1}$; and
   a band-pass type first filter structured to filter the intermediate frequency signal,
   wherein the front-end circuit is structured to supply a baseband signal based on the intermediate frequency signal to a digitizer, and
   the local frequency $f_{LO1}$ can be selected from a plurality of frequencies $f_0, f_1, \ldots$ having a frequency interval $\Delta f$ equal to or narrower than a bandwidth BW of the first filter, frequency interval $\Delta f$ is narrower than the bandwith BW of the first filter, and where the front-end circuit further comprises:
a pair of second frequency mixers structured to down-convert the intermediate frequency signal that has passed through the first filter, and separate the intermediate frequency signal into an in-phase component and a quadrature component; and
a pair of second filters structured to filter an output of the pair of second frequency mixers.

5. A test system comprising:
a front-end circuit;
a digitizer structured to convert an output of the front-end circuit into digital waveform data; and
a computer structured to process the waveform data,
wherein the front-end circuit used for testing an RF signal from a device under test,
the RF signal generated by modulating a carrier signal having a carrier frequency $f_C$ with a wideband baseband signal,
the front-end circuit comprising:
a variable frequency oscillator structured to generate a local signal having a variable local frequency $f_{LO1}$;
a first frequency mixer structured to frequency-mix the local signal and the RF signal to generate an intermediate frequency signal having a frequency $f_C$-$f_{LO1}$; and
a band-pass type first filter structured to filter the intermediate frequency signal,
wherein the front-end circuit is structured to supply a baseband signal based on the intermediate frequency signal to a digitizer, and
the local frequency $f_{LO1}$ can be selected from a plurality of frequencies $f_0, f_1, \ldots$ having a frequency interval $\Delta f$ equal to or narrower than a bandwidth BW of the first filter.

6. The test system according to claim 5,
wherein the computer is structured to
convert waveform data $DW_1, DW_2 \ldots$ generated by the digitizer for each of a plurality of frequencies $f_0, f_1, \ldots$ of the local frequency $f_{LO1}$, to spectral data $DF_1, DF_2 \ldots$ of a frequency domain, and
shift and synthesize the spectral data $DF_1, DF_2 \ldots$ on a frequency axis.

7. The test system according to claim 6,
wherein the interval $\Delta f$ of the local frequency $f_{LO1}$ is narrower than a bandwidth BW of the first filter,
the wideband baseband signal includes a plurality of subcarriers, and
the computer corrects each spectral data DF based on common subcarrier data included in kth (k=0, 1, 2, ...) spectral data $DF_k$ and k+1th spectral data $DF_{k+1}$.

8. A computer used in a test system for testing an RF signal from a device under test,
the RF signal generated by modulating a carrier signal having a carrier frequency $f_C$ with a wideband baseband signal,
the test system comprising:
a variable frequency oscillator structured to generate a local signal having a variable local frequency $f_{LO1}$;
a first frequency mixer structured to frequency-mix the local signal and the RF signal to generate an intermediate frequency signal having a frequency $f_C$-$f_{LO1}$;
a band-pass type first filter structured to filter the intermediate frequency signal; and
an A/D converter structured to convert a baseband signal based on the intermediate frequency signal that has passed through the first filter to digital waveform data,
wherein the computer is structured to
discretely switch the local frequency $f_{LO1}$ among a plurality of frequencies $f_0, f_1, \ldots$ having a frequency interval $\Delta f$ equal to or narrower than a bandwidth BW of the first filter,
convert waveform data $DW_0, DW_1 \ldots$ obtained for each of the plurality of frequencies $f_0, f_1 \ldots$ into spectral data $DF_0, DF_1 \ldots$ in a frequency domain, and
shift the spectral data $DF_0, DF_1 \ldots$ on a frequency axis and synthesize the shifted spectral data $DF_{s0}, DF_{s1}$.

9. The computer according to claim 8,
wherein the frequency interval $\Delta f$ is narrower than a bandwidth BW of the first filter,
the wideband baseband signal includes a plurality of subcarriers, and
the computer corrects spectral data DF based on common subcarrier data included in kth (k=0, 1, 2, ...) spectral data $DF_k$ and k+1th spectral data $DF_{k+1}$.

10. A non-transitory computer-readable storage medium storing a program executed in a computer used in a test system for testing an RF signal from a device under test,
the RF signal generated by modulating a carrier signal having a carrier frequency $f_C$ with a wideband baseband signal,
the test system comprising:
a variable frequency oscillator structured to generate a local signal having a variable local frequency $f_{LO1}$;
a first frequency mixer structured to frequency-mix the local signal and the RF signal to generate an intermediate frequency signal having a frequency $f_C$-$f_{LO1}$;
a band-pass type first filter structured to filter the intermediate frequency signal; and
an A/D converter structured to convert a baseband signal based on the intermediate frequency signal that has passed through the first filter to digital waveform data,
wherein the program causes the computer to perform processing of
discretely switching the local frequency $f_{LO1}$ among a plurality of frequencies $f_0, f_1, \ldots$ having a frequency interval $\Delta f$ equal to or narrower than a bandwidth BW of the first filter,
converting waveform data $DW_0, DW_1, \ldots$ obtained for each of the plurality of frequencies $f_0, f_1, \ldots$ into spectral data $DF_0, DF_1 \ldots$ in a frequency domain, and
shifting the spectral data $DF_0, DF_1 \ldots$ on a frequency axis and synthesizing the shifted spectral data $DF_0, DF_1$.

11. The non-transitory computer-readable storage medium storing the program according to claim 10,
wherein the frequency interval $\Delta f$ is narrower than a bandwidth BW of the first filter,
the wideband baseband signal includes a plurality of subcarriers, and
the program causes the computer to further perform processing of
correcting each spectral data DF based on common subcarrier data included in kth (k=0, 1, 2, ...) spectral data $DF_k$ and k+1th spectral data $DF_{k+1}$.

* * * * *